US010825816B2

(12) United States Patent
Gao et al.

(10) Patent No.: US 10,825,816 B2
(45) Date of Patent: Nov. 3, 2020

(54) RECESSED ACCESS DEVICES AND DRAM CONSTRUCTIONS

(71) Applicant: Micron Technology, Inc., Boise, ID (US)

(72) Inventors: Yunfei Gao, Boise, ID (US); Richard J. Hill, Boise, ID (US); Gurtej S. Sandhu, Boise, ID (US); Haitao Liu, Boise, ID (US); Deepak Chandra Pandey, Boise, ID (US); Srinivas Pulugurtha, Boise, ID (US); Kamal M. Karda, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/898,086

(22) Filed: Feb. 15, 2018

(65) Prior Publication Data
US 2019/0206870 A1 Jul. 4, 2019

Related U.S. Application Data

(60) Provisional application No. 62/611,336, filed on Dec. 28, 2017.

(51) Int. Cl.
*H01L 23/58* (2006.01)
*H01L 29/76* (2006.01)
(Continued)

(52) U.S. Cl.
CPC .. *H01L 27/10823* (2013.01); *H01L 27/10814* (2013.01); *H01L 27/10826* (2013.01);
(Continued)

(58) Field of Classification Search
CPC ....... H01L 27/10873–10879; H01L 27/10823; H01L 29/4236; H01L 29/7825;
(Continued)

(56) References Cited

U.S. PATENT DOCUMENTS

| 4,237,473 A | 12/1980 | Chiang |
| 5,138,407 A | 9/1992 | Hirtz et al. |

(Continued)

FOREIGN PATENT DOCUMENTS

| EP | 1936696 | 6/2008 |
| KR | 10-0560654 | 3/2006 |

(Continued)

OTHER PUBLICATIONS

Kotulak, "Growth And Analysis Of Gallium Phosphide On Silicon For Very High Efficiency Solar Cells", A these submitted by the Faculty of the University of Delaware in partial fulfillment of the requirements for the degree of Master of Science in Electrical and Computer Engineering, University of Delaware, 2001, United States 83 pages.

(Continued)

*Primary Examiner* — Mary A Wilczewski
*Assistant Examiner* — Tsz K Chiu
(74) *Attorney, Agent, or Firm* — Wells St. John P.S.

(57) ABSTRACT

A recessed access device comprises a conductive gate in a trench in semiconductor material. A gate insulator is along sidewalls and a base of the trench between the conductive gate and the semiconductor material. A pair of source/drain regions is in upper portions of the semiconductor material on opposing sides of the trench. A channel region is in the semiconductor material below the pair of source/drain regions along the trench sidewalls and around the trench base. At least some of the channel region comprises GaP.

18 Claims, 9 Drawing Sheets

(51) Int. Cl.
| | |
|---|---|
| *H01L 29/94* | (2006.01) |
| *H01L 31/062* | (2012.01) |
| *H01L 27/108* | (2006.01) |
| *H01L 29/423* | (2006.01) |
| *H01L 29/20* | (2006.01) |
| *H01L 29/78* | (2006.01) |
| *H01L 29/417* | (2006.01) |
| *H01L 29/10* | (2006.01) |
| *H01L 29/267* | (2006.01) |

(52) U.S. Cl.
CPC .... *H01L 27/10879* (2013.01); *H01L 29/1054* (2013.01); *H01L 29/20* (2013.01); *H01L 29/267* (2013.01); *H01L 29/41783* (2013.01); *H01L 29/4236* (2013.01); *H01L 29/78* (2013.01)

(58) Field of Classification Search
CPC ....... H01L 29/66613–66628; H01L 29/42336; H01L 29/42352; H01L 27/10826; H01L 27/10879
See application file for complete search history.

(56) References Cited

U.S. PATENT DOCUMENTS

| | | | |
|---|---|---|---|
| 5,714,777 A | 2/1998 | Ismail et al. | |
| 5,930,611 A | 7/1999 | Okamoto | |
| 7,071,065 B1 | 7/2006 | Xiang et al. | |
| 7,125,815 B2 | 10/2006 | Vaartstra | |
| 7,238,974 B2* | 7/2007 | Strassburg | H01L 27/115 257/208 |
| 7,342,265 B2* | 3/2008 | Kuwahara | G06F 17/5068 257/288 |
| 7,361,536 B2* | 4/2008 | Hwang | H01L 21/8252 257/194 |
| 7,393,783 B2 | 7/2008 | Derderian | |
| 7,402,504 B2 | 7/2008 | Brabant et al. | |
| 7,514,372 B2 | 4/2009 | Arena et al. | |
| 7,537,804 B2 | 5/2009 | Srividya et al. | |
| 7,544,388 B2 | 6/2009 | Sarigiannis et al. | |
| 7,682,947 B2 | 3/2010 | Brabant et al. | |
| 7,700,942 B2* | 4/2010 | Iijima | H01L 27/0207 257/27 |
| 7,851,307 B2 | 12/2010 | Ramaswamy et al. | |
| 7,928,427 B1 | 4/2011 | Chang | |
| 8,163,341 B2 | 4/2012 | Quick et al. | |
| 8,431,459 B2 | 4/2013 | Takenaka et al. | |
| 8,481,122 B2 | 7/2013 | Carlson et al. | |
| 8,518,486 B2 | 8/2013 | Mirin et al. | |
| 8,536,621 B2* | 9/2013 | Dewey | H01L 29/66666 257/192 |
| 8,748,269 B2* | 6/2014 | Dewey | H01L 29/66666 438/270 |
| 8,823,011 B2 | 9/2014 | Chan | |
| 9,218,963 B2 | 12/2015 | Matero | |
| 9,499,907 B2 | 11/2016 | Song et al. | |
| 9,728,626 B1* | 8/2017 | Schepis | H01L 29/66795 |
| 10,084,074 B1* | 9/2018 | Yang | H01L 21/28587 |
| 10,096,710 B2 | 10/2018 | Wu et al. | |
| 10,319,725 B2* | 6/2019 | Juengling | H01L 29/785 |
| 10,388,658 B1* | 8/2019 | Ramaswamy | H01L 27/10891 |
| 10,475,692 B2* | 11/2019 | Licausi | H01L 23/5286 |
| 10,522,362 B2* | 12/2019 | Kim | H01L 27/10855 |
| 10,546,862 B1* | 1/2020 | Yang | H01L 21/76831 |
| 10,600,695 B2* | 3/2020 | Lee | H01L 21/82388 |
| 10,636,796 B2* | 4/2020 | Takesako | H01L 21/845 |
| 2001/0048119 A1 | 12/2001 | Mizuno et al. | |
| 2002/0028531 A1 | 3/2002 | Wang et al. | |
| 2002/0051894 A1* | 5/2002 | Yoshikawa | C07D 271/10 428/690 |
| 2002/0142539 A1 | 10/2002 | Tu et al. | |
| 2005/0023555 A1 | 2/2005 | Yoshida et al. | |
| 2005/0159017 A1 | 7/2005 | Kim et al. | |
| 2005/0280052 A1 | 12/2005 | Holz et al. | |
| 2006/0214236 A1 | 9/2006 | Chien | |
| 2006/0216894 A1* | 9/2006 | Parekh | H01L 27/10823 438/270 |
| 2007/0032029 A1 | 2/2007 | Chow et al. | |
| 2007/0243688 A1 | 10/2007 | Liao | |
| 2007/0246803 A1* | 10/2007 | Haller | H01L 21/82341 257/640 |
| 2008/0085587 A1* | 4/2008 | Wells | H01L 21/02381 438/455 |
| 2008/0169485 A1 | 7/2008 | Heyns et al. | |
| 2009/0045411 A1 | 2/2009 | Lin et al. | |
| 2009/0179227 A1 | 7/2009 | Otake et al. | |
| 2009/0311634 A1 | 12/2009 | Yue et al. | |
| 2010/0052039 A1 | 3/2010 | Matsushita et al. | |
| 2010/0105192 A1 | 4/2010 | Akae et al. | |
| 2010/0109051 A1 | 5/2010 | Wu et al. | |
| 2010/0155790 A1 | 6/2010 | Lin et al. | |
| 2010/0276668 A1* | 11/2010 | Ko | H01L 29/41775 257/24 |
| 2010/0308379 A1 | 12/2010 | Kuan et al. | |
| 2011/0084284 A1 | 4/2011 | Zhang et al. | |
| 2011/0108885 A1 | 5/2011 | Sazawa et al. | |
| 2011/0227145 A1* | 9/2011 | Renn | H01L 27/10823 257/328 |
| 2012/0080753 A1 | 4/2012 | Singh et al. | |
| 2012/0190185 A1 | 7/2012 | Rogers | |
| 2012/0256259 A1 | 10/2012 | Surthi et al. | |
| 2012/0298958 A1* | 11/2012 | Dewey | H01L 29/66666 257/24 |
| 2013/0093497 A1* | 4/2013 | Lee | H01L 29/78609 327/420 |
| 2013/0149830 A1 | 6/2013 | Rhee et al. | |
| 2013/0193400 A1 | 8/2013 | Sandhu et al. | |
| 2013/0221450 A1 | 8/2013 | Mao et al. | |
| 2013/0233240 A1 | 9/2013 | Cody et al. | |
| 2013/0307025 A1 | 11/2013 | Pal et al. | |
| 2013/0337623 A1* | 12/2013 | Dewey | H01L 29/66666 438/270 |
| 2014/0167174 A1 | 6/2014 | Choi et al. | |
| 2014/0315364 A1 | 10/2014 | Guha et al. | |
| 2015/0004805 A1 | 1/2015 | Omstead et al. | |
| 2015/0028406 A1* | 1/2015 | Tang | H01L 29/66621 257/296 |
| 2015/0091060 A1* | 4/2015 | Yang | H01L 29/66431 257/194 |
| 2015/0093868 A1 | 4/2015 | Obradovic et al. | |
| 2015/0102387 A1 | 4/2015 | Shih et al. | |
| 2015/0137268 A1 | 5/2015 | Fung | |
| 2015/0155381 A1 | 6/2015 | Song | |
| 2016/0099143 A1 | 4/2016 | Yan et al. | |
| 2016/0204202 A1 | 7/2016 | Jain | |
| 2017/0117401 A1* | 4/2017 | Shi | H01L 29/2003 |
| 2017/0207082 A1 | 7/2017 | Wang et al. | |
| 2017/0345927 A1 | 11/2017 | Cantoro et al. | |
| 2017/0352760 A1* | 12/2017 | Wu | H01L 21/3065 |
| 2018/0230591 A1 | 8/2018 | Jang et al. | |

FOREIGN PATENT DOCUMENTS

| | | |
|---|---|---|
| KR | 10-2017-0019668 | 2/2017 |
| TW | 201238057 | 9/2012 |
| TW | 201442233 | 11/2014 |
| TW | 201736633 | 10/2017 |
| WO | WO PCT/US2018/065633 | 4/2019 |

OTHER PUBLICATIONS

U.S. Appl. No. 62/537,842, filed Jul. 27, 2017, by Sandhu et al.
Ozturk, "Source/Drain Junctions And Contacts for 45nm CMOA And Beyond", North Carolina State University Department of Electrical and Computer Engineering, 2005 International Conference on Characterization and Metrology for USLI Technology, 2005, United States, 34 pages.

(56) References Cited

OTHER PUBLICATIONS

Sun, "Power Metal-Oxide-Semiconductor Field-Effect Transistor With Strained Silicon And Silicon Germanlum Channel", A Dissertation Sumitted for the Degree of Doctor of Philosophy in the Dept. of Elec. Eng. in the College of Eng. and Comp. Science, Univ. of Florida, 2010, 104 pages.

Baliga et al. "Seminconductors for high-voltage, vertical channel field effect transistors", Journal of Applied Physics 53(3), Mar. 1982, United States, pp. 1759-1764.

Kang et al., "Change In Electrical Characteristics Of Gallium Phosphide Nanowire Transistors Under Different Environments", 4th IEEE Conference on Nanotechnology, Aug. 16-19, 2004, Published in United States, pp. 370-372.

Kotulak, "Growth And Analysis Of Gallium Phosphide On Silicon For Very High Efficiency Solar Cells", A thesis submitted by the Faculty of the Univ. of Delaware for the degree of Master of Science in Electrical and Computer Engineering, Univ. of Delaware, 2001, United States, 83 pages.

Manna et al., "A Novel Si/SiGe Sandwich Polysilicon TFT for SRAM Applications", IEEE, Jun. 19-21, 1995, United States, pp. 156-157.

Pal et al., "Addressing Key Challenges in 1T-DRAM: Rention Time, Scaling and Varability—Using a Novel Design with GaP Source-Drain", IEEE, 2013, United States, pp. 376-379.

Pal et al., "Electrical Characterization Of GaP-Silicon Interface For Memory And Transistor Applications", IEEE Transactions on Electron Devices, vol. 60, No. 7, Jul. 2013, United States, pp. 2238-2245.

U.S. Appl. No. 15/843,402, filed Jul. 10, 2017, by Carlson et al.
U.S. Appl. No. 15/848,982, filed Dec. 20, 2017, by Ramaswamy.
U.S. Appl. No. 15/860,388, filed Jan. 1, 2018, by Smythe et al.
U.S. Appl. No. 15/890,147, filed Feb. 6, 2018, by Ramaswamy.

Ozturk, "Source/Drain Junctions And Contacts For 45 nm CMOS And Beyond", North Carolina State University Department of Electrical and Computer Engineering, 2005 International Conference on Characterization and Metrology for USLI Technology, 2005, United States, 34 pages.

Sun, "Power Metal-Oxide-Semiconductor Field-Effect Transistor With Strained Silicon And Silicon Germanium Channel", A Dissertation Sumitted for the Degree of Doctor of Philosophy in the Dept. of Elec. Engineering in the College of Eng. and Comp. Science, Univ. of Florida, 2010, 104 pages.

\* cited by examiner

Vcell = 1.1V
Vdgt = 0V
Vbody = -0.5V
Rdgt =10K ohm
Rcell = 20K ohm

RECESSED ACCESS DEVICES AND DRAM CONSTRUCTIONS

TECHNICAL FIELD

Embodiments disclosed herein pertain to recessed access devices and to DRAM constructions.

BACKGROUND

A recessed access device is a field effect transistor having its gate construction buried within a trench formed in semiconductive material. The gate construction includes a gate insulator which lines the trench and conductive gate material within the trench laterally inward of the gate insulator. A source/drain region is formed in outermost regions of the semiconductive material on each of opposing sides of the trench. When the two source/drain regions are at different voltages and a suitable voltage is applied to the conductive gate material, current ($I_{on}$) flows through the semiconductive material between the source/drain regions along the trench sidewalls and around the base of the trench (i.e., a conductive channel forms through which current flows between the two source/drain regions). It is desirable to attain high device on-current ($I_{on}$) and low device off-current (e.g. leakage current $I_{off}$) in recessed access devices.

Recessed access devices are typically devoid of non-volatile charge-storage devices (yet may be fabricated to include such), and regardless may be used in memory circuitry, for example DRAM circuitry. Achieving lower $I_{off}$ may result in less disturb and longer retention of the information stored in a memory cell incorporating a recessed access device.

DETAILED DESCRIPTION OF EXAMPLE EMBODIMENTS

Figure 1:
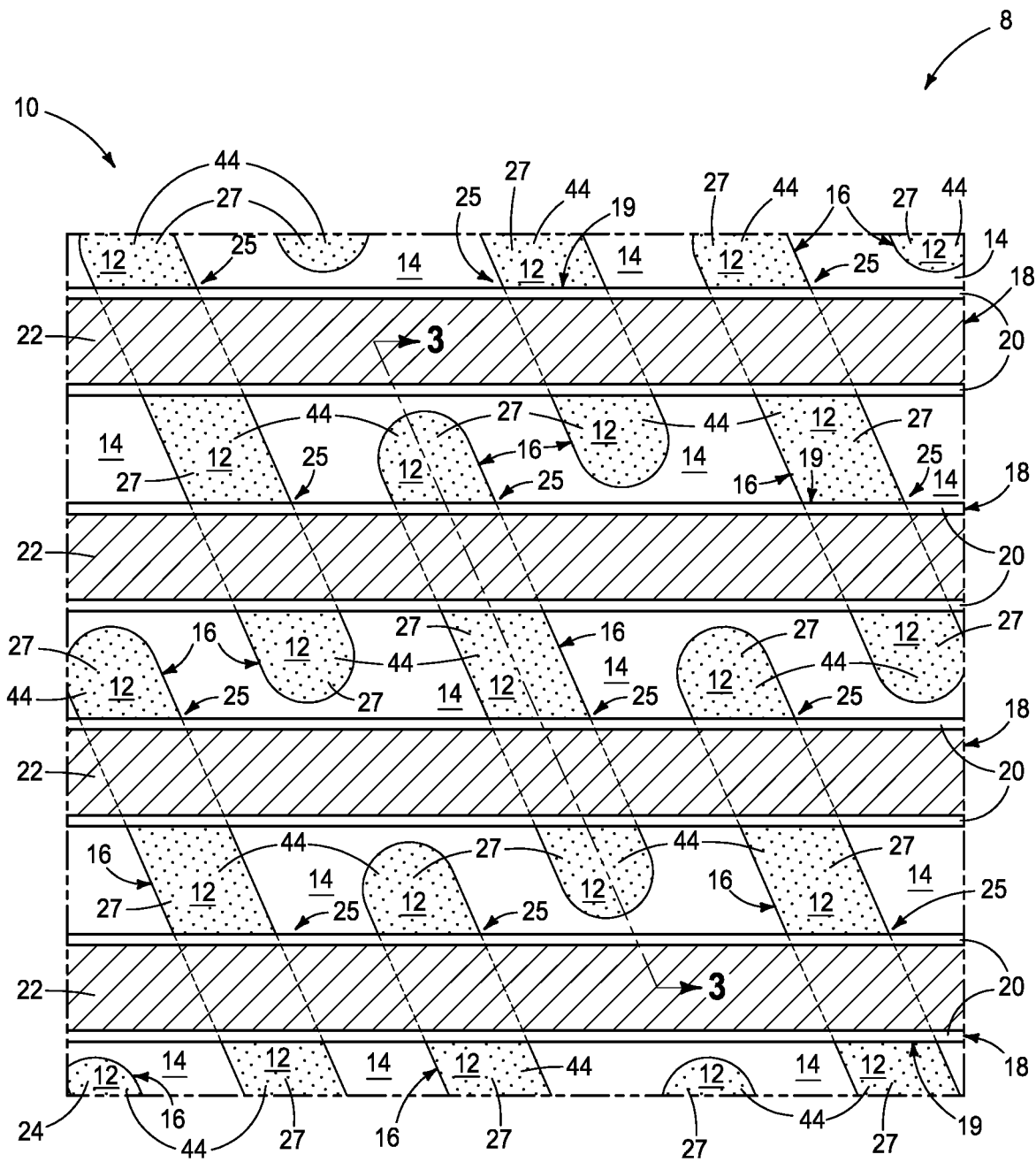
FIG. 1 is a cross-sectional view of a recessed access device and of a DRAM construction in accordance with some embodiments of the invention, and is taken through line 1-1 in FIG. 3.

Embodiments of the invention encompass recessed access devices and DRAM constructions. First example embodiments are initially described with reference to FIGS. 1-3 which show an example fragment of a substrate construction 8 comprising an array or array area 10 that in one embodiment comprises memory cells that have been fabricated relative to a base substrate 11. Substrate 11 may comprise any one or more of conductive/conductor/conducting (i.e., electrically herein), semiconductive/semiconductor/semiconducting, and insulative/insulator/insulating (i.e., electrically herein) materials. Various materials are above base substrate 11. Materials may be aside, elevationally inward, or elevationally outward of the FIGS. 1-3-depicted materials. For example, other partially or wholly fabricated components of integrated circuitry may be provided somewhere above, about, or within base substrate 11. Control and/or other peripheral circuitry for operating components within a memory array may also be fabricated, and may or may not be wholly or partially within a memory array or sub-array. Further, multiple sub-arrays may also be fabricated and operated independently, in tandem, or otherwise relative one another. As used in this document, a "sub-array" may also be considered as an array.

Base substrate 11 comprises semiconductor material 12 (e.g., appropriately and variously doped monocrystalline silicon and/or other semiconductive material), trench isolation regions 14 (e.g., silicon nitride and/or doped or undoped silicon dioxide), and active area regions 16 comprising suitably and variously-doped semiconductor material 12. In one embodiment, construction 8 comprises memory cells 75 (FIG. 3), for example DRAM memory cells individually comprising a field effect transistor device 25 and a charge-storage device 85 (e.g., a capacitor). However, embodiments of the invention encompass other memory cells and other constructions of integrated circuitry independent of whether containing memory cells.

Figure 3:
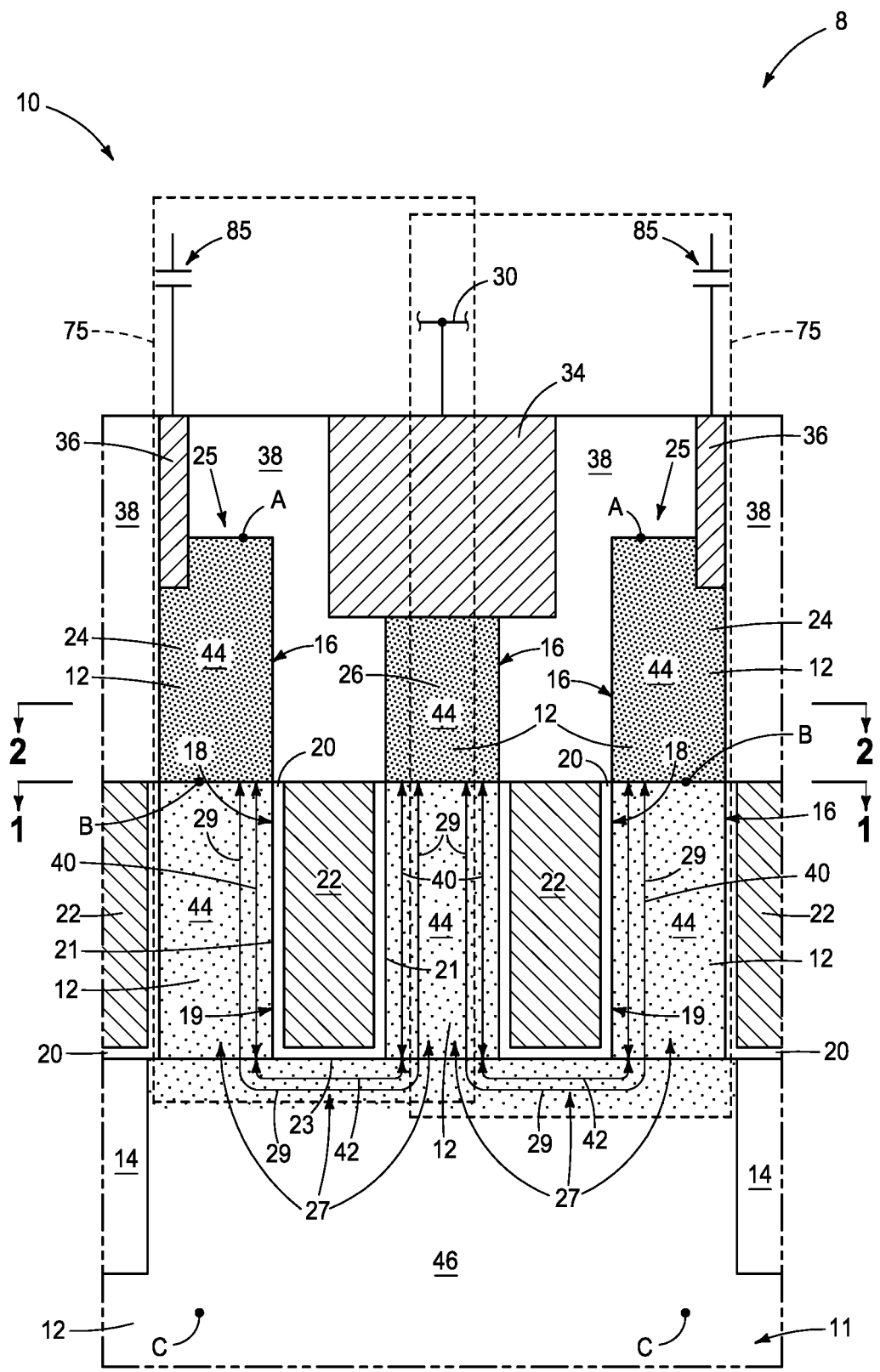
FIG. 3 is a diagrammatic hybrid schematic and cross-sectional view taken through line 3-3 in FIGS. 1 and 2.

Field effect transistors 25 are in the form of recessed access devices (a type of construction of a field effect transistor), with FIG. 3 showing of pair of such transistors/devices 25. Such individually include buried access line constructions 18, for example within trenches 19 in semiconductor material 12. Constructions 18 comprise conductive gate material 22 (e.g., comprising, consisting essentially of, or consisting of conductively-doped semiconductor material and/or metal material) that functions as a conductive gate of individual devices 25. A gate insulator 20 (e.g., comprising, consisting essentially of, or consisting of silicon dioxide and/or silicon nitride) is along sidewalls 21 and a base 23 of individual trenches 19 between conductive gate material 22 and semiconductor material 12. Individual devices 25 comprise a pair of source/drain regions 24, 26 in upper portions of semiconductor material 12 on opposing sides of individual trenches 19 (e.g., regions 24, 26 being laterally outward of and higher than access line constructions 18). Each of source/drain regions 24, 26 comprises at least a part thereof having a conductivity-increasing dopant therein that is of maximum concentration of such conductivity-increasing dopant within the respective source/drain region 24, 26, for example to render such part to be conductive (e.g., having a maximum dopant concentration of at least $10^{19}$ atoms/cm$^3$). Accordingly, all or only a part of each source/drain region 24, 26 may have such maximum concentration of conductivity-increasing dopant. Source/drain regions 24 and/or 26 may include other doped regions (not shown), for example halo regions, LDD regions, etc.

One of the source/drain regions (e.g., region 26) of the pair of source/drain regions is laterally between conductive gate material 22 and is shared by the pair of devices 25. Others of the source/drain regions (e.g., regions 24) of the pair of source/drain regions are not shared by the pair of devices 25. Thus, in the example embodiment, each active area region 16 comprises two devices 25 with each sharing a central source/drain region 26. A digitline 30 is directly electrically coupled to the one shared source/drain region 26. A pair of capacitors 85 individually are directly electrically coupled to one of the other source/drain regions 24. A conductive via 34 is shown interconnecting shared source/drain region 26 with digitline 30. Conductive vias 36 are shown interconnecting non-shared source/drain regions 24 with individual capacitors 85. Example insulator material 38 (e.g., comprising, consisting essentially of, or consisting of silicon nitride and/or doped or undoped silicon dioxide) surrounds vias 34, 36.

A channel region 27 is in semiconductor material 12 below pair of source/drain regions 24, 26 along trench sidewalls 21 and around trench base 23. Channel region 27 may be suitably doped with a conductivity-increasing dopant likely of the opposite conductivity-type of the dopant in source/drain regions 24, 26, and for example that is at a maximum concentration in the channel of no greater than $1 \times 10^{16}$ atoms/cm$^3$. When suitable voltage is applied to gate material 22 of an access line construction 18, a conductive channel forms (e.g., along a channel current-flow line/path 29 [FIG. 3]) within channel region 27 proximate gate insulator 20 such that current is capable of flowing between a pair of source/drain regions 24 and 26 under the access line construction 18 within an individual active area region 16. Stippling is diagrammatically shown to indicate primary conductivity-modifying dopant concentration (regardless of type) in material 12, with denser stippling indicating greater dopant concentration and lighter stippling indicating lower dopant concentration. Conductivity-modifying dopant may be, and would likely be, un-stippled portions of material 12. Only two different stippling densities are shown for convenience, and additional dopant concentrations may be used and constant dopant concentration is not required in any region (e.g., see FIG. 4 and the description thereof below).

Figure 2:
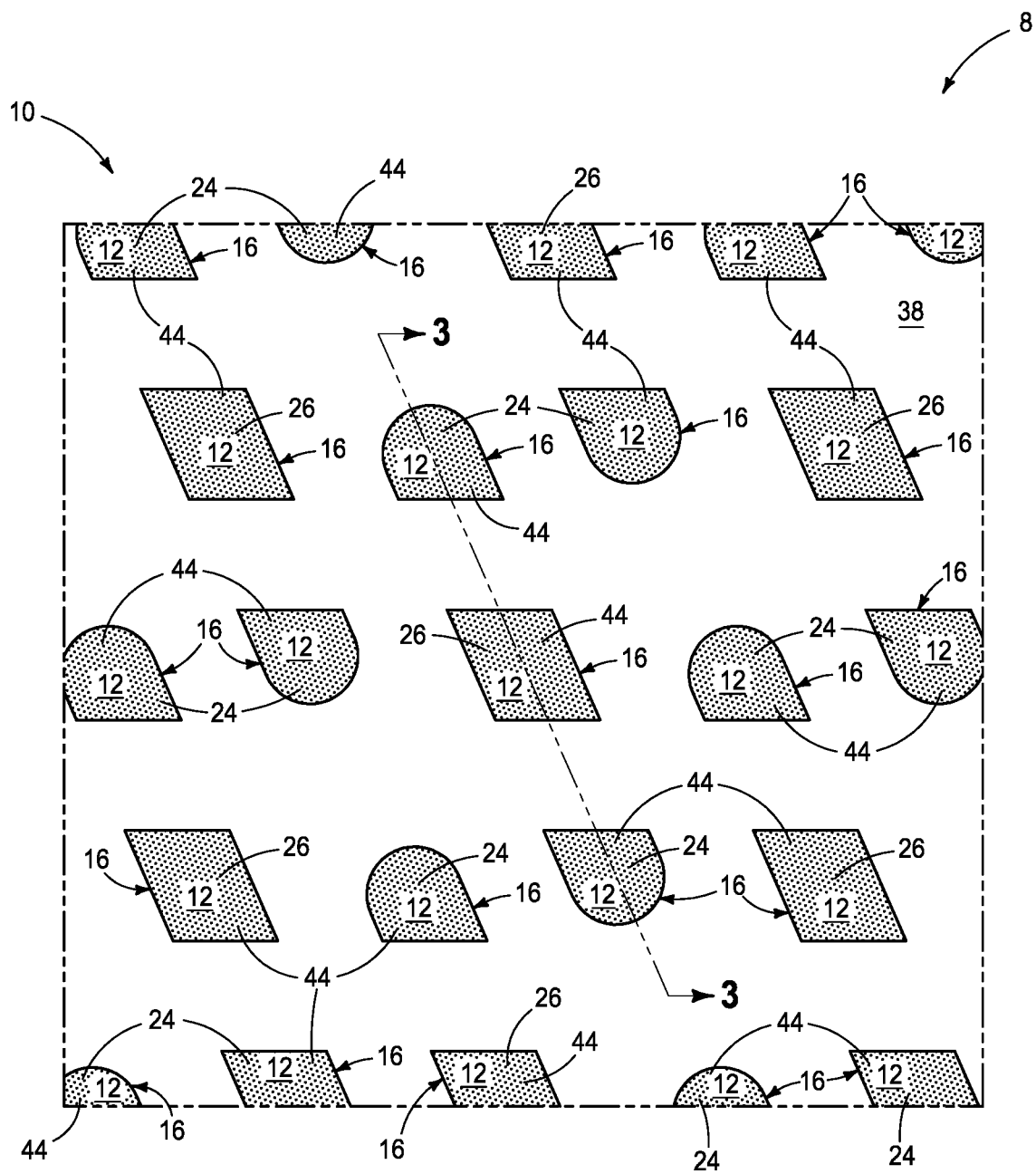
FIG. 2 is a view taken through line 2-2 in FIG. 3.

At least some of channel region 27 comprises GaP (gallium phosphide). FIGS. 1-3 show an example embodiment wherein only some of channel region 27 comprises GaP. Specifically, for example, portions 40 (FIG. 3; e.g., which may be referred to as "those portions") of channel region 27 that are along all of trench sidewalls 21 below pair of source/drain regions 24, 26 comprise GaP, for example as material designated with numeral 44 (e.g., and being part of semiconductor material 12). Portion 42 (e.g., which may be referred to as "that portion") of channel region 27 that is directly below trench base 23 is devoid of GaP, and as material designated with numeral 46 (e.g., and being part of semiconductor material 12). In this document, "devoid of GaP" means from no molecule of GaP per cubic centimeter (i.e., 0 molecules of GaP per cubic centimeter) to no more than $1 \times 10^{12}$ molecules of GaP per cubic centimeter. In one embodiment, portion 42 of channel region 27 that is directly below trench base 23 has no detectable GaP therein (i.e., any existing or future-developed technique not able to detect any GaP molecule in material 46). In one embodiment, the portion(s) of the channel region that comprises GaP consist(s) essentially of GaP and conductivity-modifying dopant therein, or consist(s) of GaP and conductivity-modifying dopant therein. In one embodiment, the other portion of the channel region that does not comprise GaP (e.g., portion 42) comprises Si, and in one such embodiment consists essentially of Si and conductivity-modifying dopant therein, or consists of Si and conductivity-modifying dopant therein.

In one embodiment, pair of source/drain regions 24, 26 comprises GaP, and in one such embodiment consists essentially of GaP and conductivity-modifying dopant therein, or consists of GaP and conductivity-modifying dopant therein.

Figure 4:
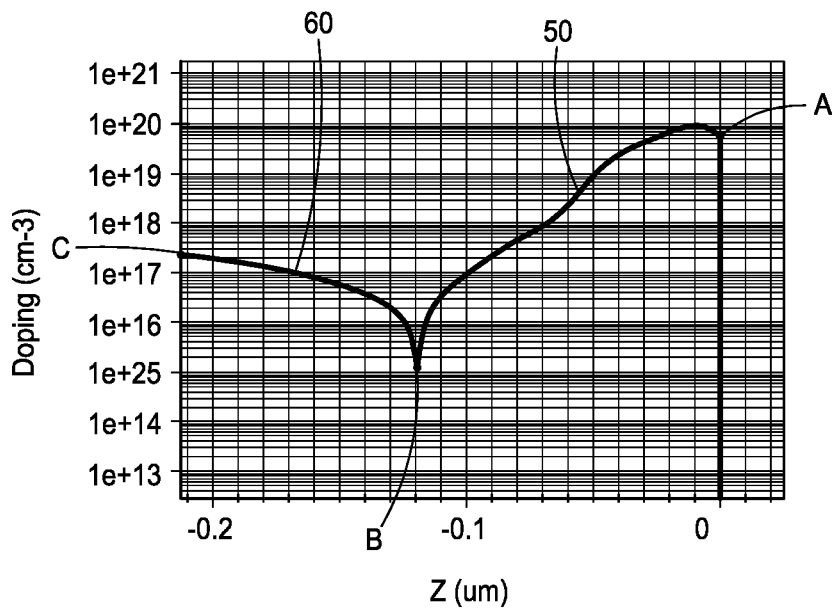
FIG. 4 is a diagram of conductivity-modifying dopant concentration and type that may be used in the embodiments of the invention.

FIG. 4 is an example plot of conductivity-modifying dopant concentration in atoms/molecules per cubic centimeter as a function of depth Z in microns in construction 8, for example at and between depths A, B, and C (FIG. 3), with line-portion 50 showing concentration of one conductivity-impurity type (e.g., "n") and line-portion 60 showing concentration of another conductivity-impurity type (e.g., "p").

Figure 5:
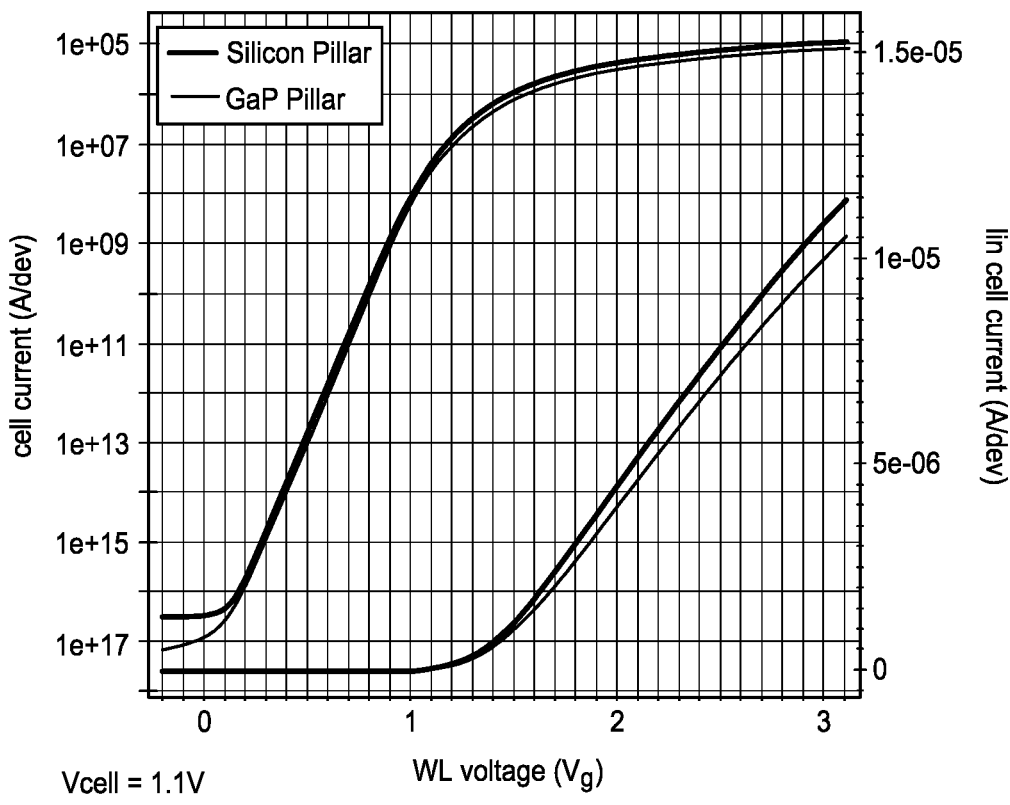
FIG. 5 is a diagram of drain current $I_d$ as a function of gate voltage $V_g$ that may occur in the embodiments of FIGS. 1-3.

FIG. 5 are plots of drain current $I_d$ (cell current) as a function of gate voltage $V_g$ (wordline voltage) for channels consisting of Si and conductivity-modifying dopant therein and for channels consisting of GaP and conductivity-modifying dopant therein. The plots are for cell voltage of 1.1V, digitline voltage of 0V, body/base substrate 11 voltage of −0.5V, digitline resistance of 10,000 ohms, and cell resistance of 20,000 ohms. The left Si and GaP curves go to the left y-axis logarithmic scale, and the right Si and GaP curves go to the right y-axis linear scale. Such plots show very comparable performance between Si and GaP channel materials, and with much lower off current ($I_{off}$; logarithmic scale) at zero wordline voltage for GaP meaning that much lower leakage current may result.

Figure 6:
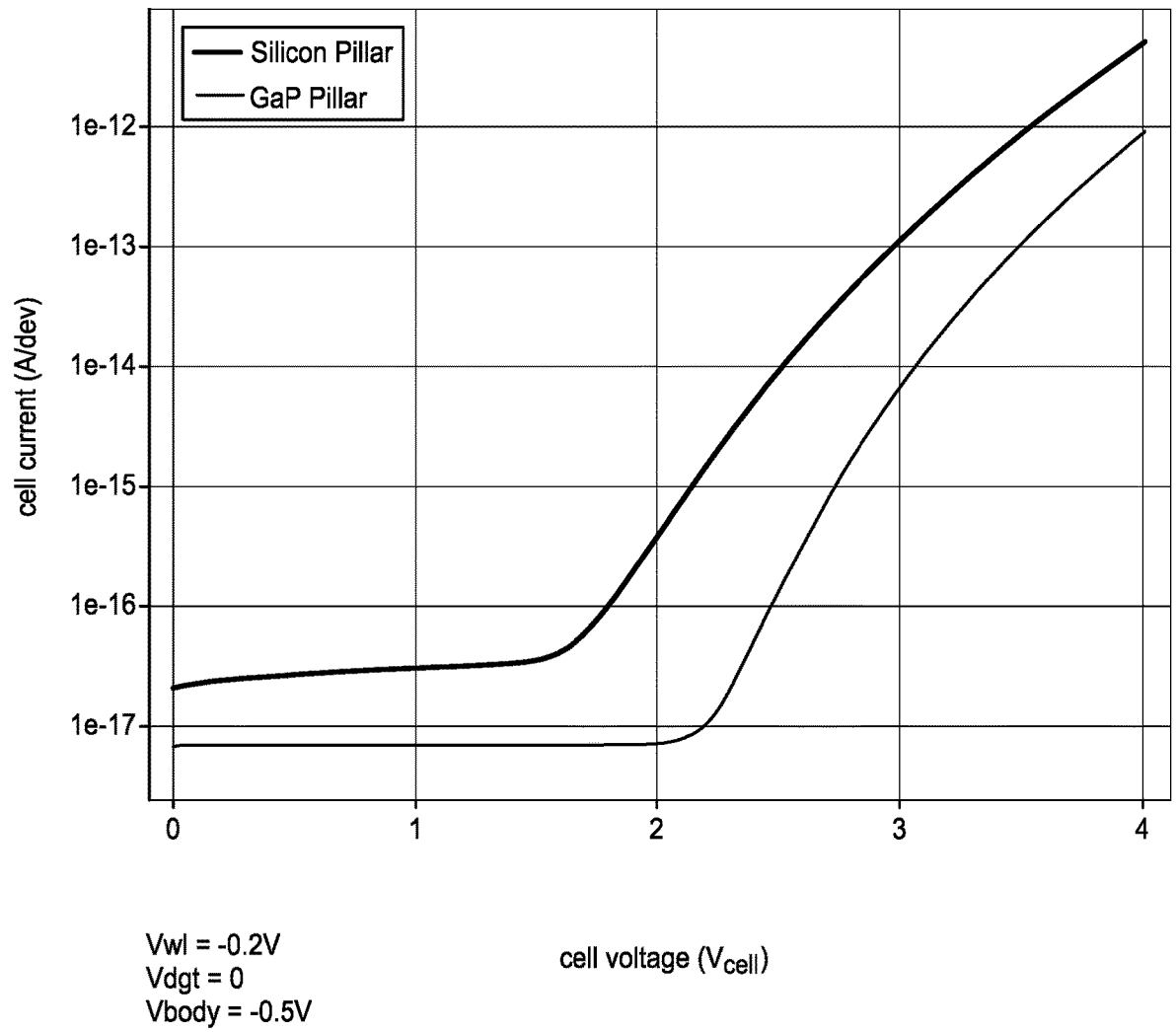
FIG. 6 is a diagram of drain current $I_d$ as a function of drain voltage $V_d$ that may occur in the embodiments of FIGS. 1-3.

FIG. 6 are plots of drain current $I_d$ as a function of drain voltage $V_d$ (cell voltage) for channels consisting of Si and conductivity-modifying dopant therein and for channels consisting of GaP and conductivity-modifying dopant therein. The plots are for wordline voltage of −0.2V, digitline voltage of 0V, and body/base substrate 11 voltage of −0.5V. Such plots essentially show that lower gate induced drain leakage (GIDL) may result for GaP channels.

Any other attribute(s) or aspect(s) as shown and/or described herein with respect to other embodiments may be used in the embodiments of FIGS. 1-3.

Figure 7:
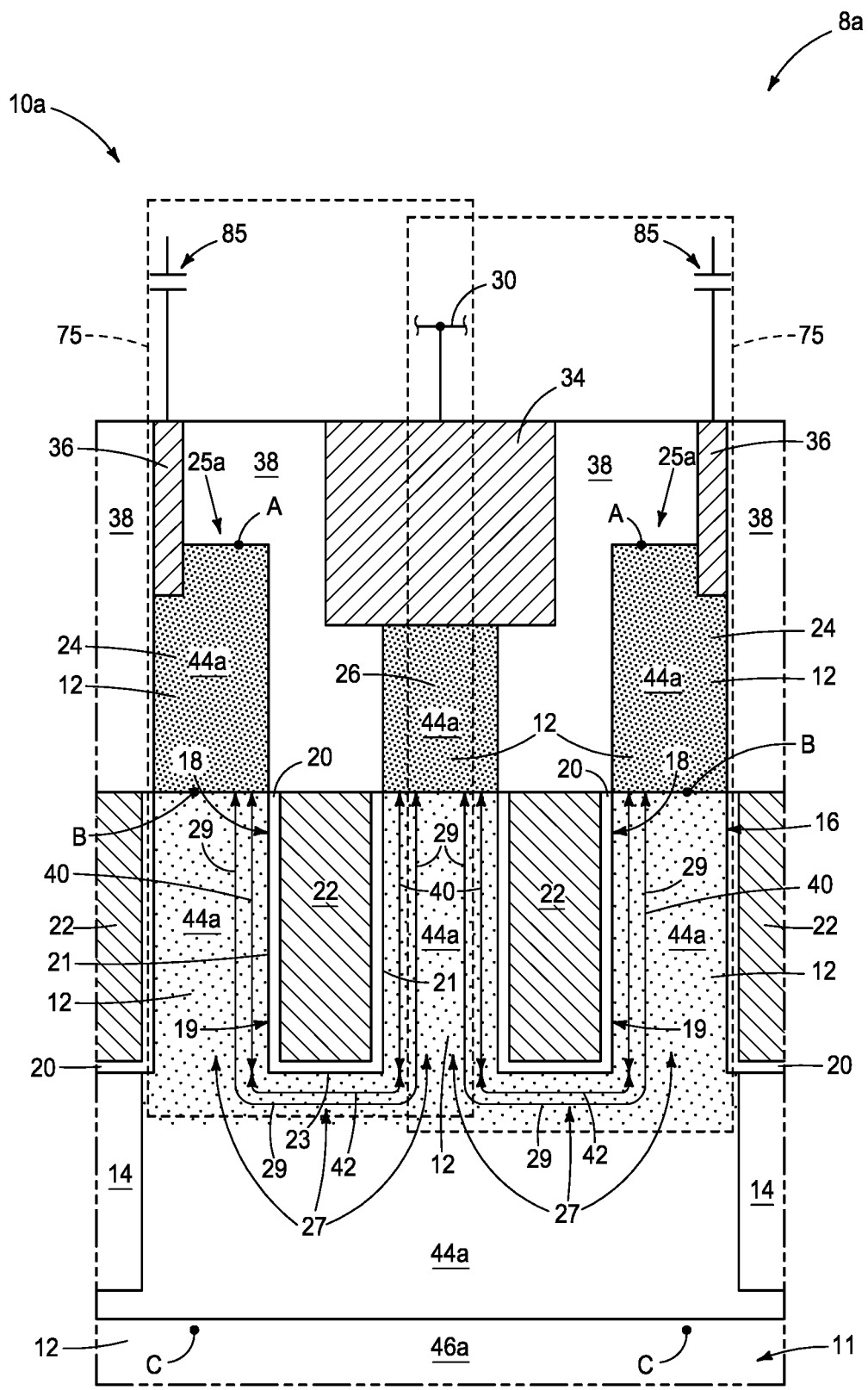
FIG. 7 is a cross-sectional view of a recessed access device and of a DRAM construction in accordance with some embodiments of the invention.

An alternate example embodiment DRAM construction 8a comprising a pair of recessed access devices 25a is shown in FIG. 7. Like numerals from the above-described embodiments have been used where appropriate, with some construction differences being indicated with the suffix "a". Construction 8a of an array 10a comprises materials 44a and 46a having an interface thereof (e.g., the horizontal line just above example depth C) that is deeper in construction 8a as compared to construction 8 (e.g., with such interface not being within current path 29 in construction 8a). Those portions 40 of channel region 27 that are along all of trench sidewalls 21 below pair of source/drain regions 24, 26 and that portion 42 of channel region 27 that is around trench base 23 comprises GaP (e.g., material 44a). In one such embodiment, those portions 40 and that portion 42 consist essentially of GaP and conductivity-modifying dopant therein, and in one embodiment consist of GaP and conductivity-modifying dopant therein. In one embodiment, GaP is directly below channel region 27 (e.g., in un-stippled material 44a below lightly-stippled channel region 27, and un-stippled material 44a may include conductivity-modifying dopant therein). Any other attribute(s) or aspect(s) as shown and/or described herein with respect to other embodiments may be used.

Figure 8:
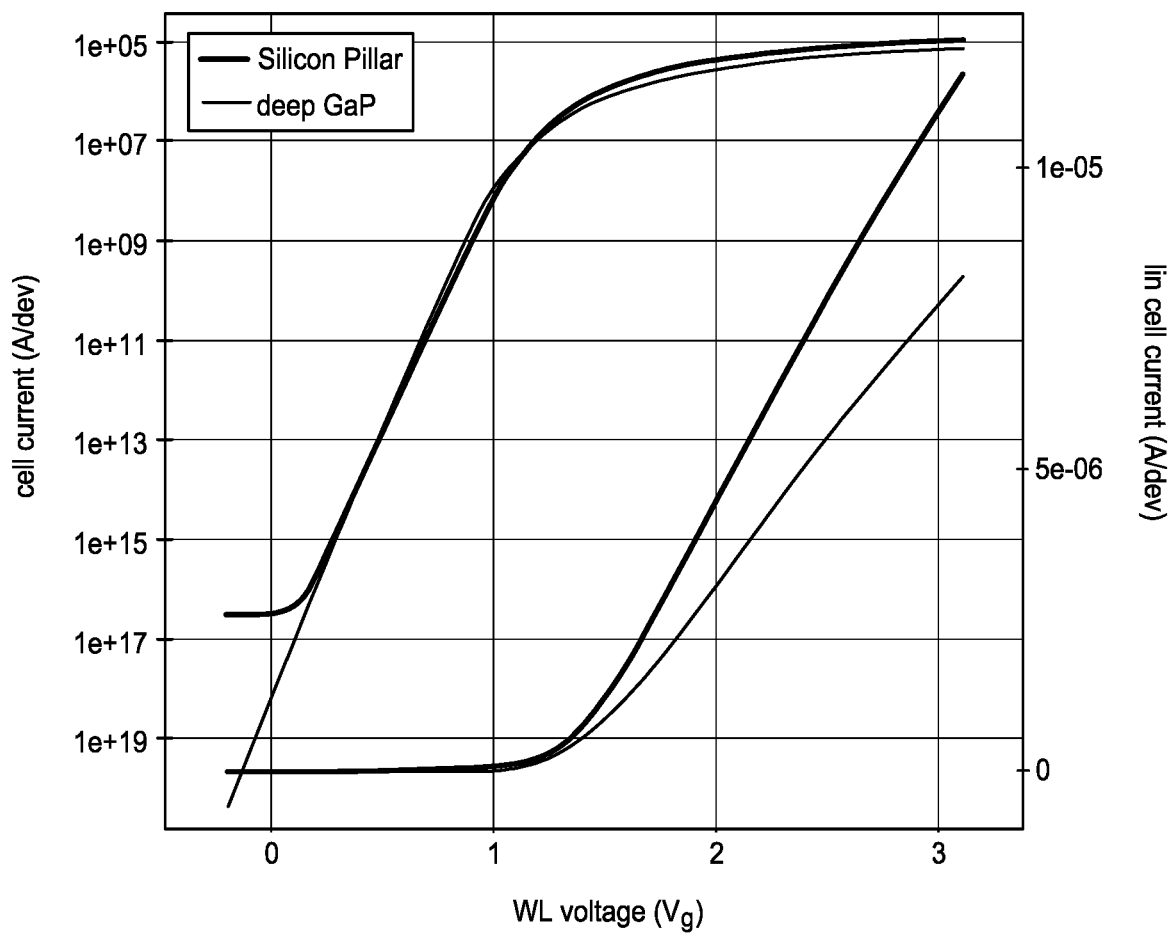
FIG. 8 is a diagram of drain current $I_d$ as a function of gate voltage $V_g$ that may occur in the embodiments of FIG. 7.

FIG. 8 is analogous to FIG. 5, but showing plots of drain current $I_d$ (cell current) as a function of gate voltage $V_g$ for channels consisting of Si and conductivity-modifying dopant therein and for channels consisting of GaP and conductivity-modifying dopant therein that may occur for the construction of FIG. 7. The plots are again for cell voltage of 1.1V, digitline voltage of 0V, body/base substrate 11 voltage of −0.5V, digitline resistance of 10,000 ohms, and cell resistance of 20,000 ohms.

Figure 9:
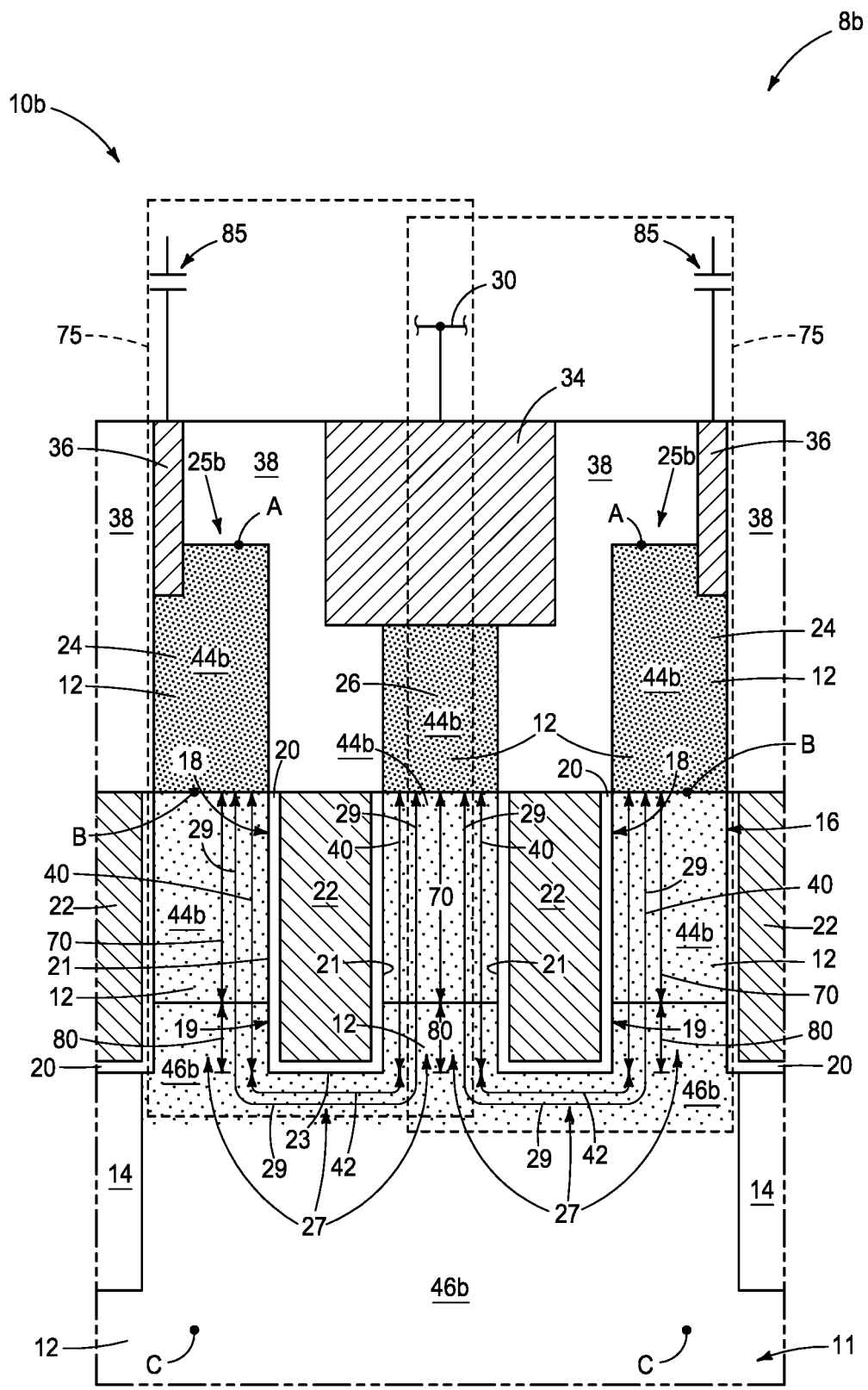
FIG. 9 is a cross-sectional view of a recessed access device and of a DRAM construction in accordance with some embodiments of the invention.

Another alternate example embodiment DRAM construction 8b comprising a pair of recessed access devices 25b is shown in FIG. 9. Like numerals from the above-described embodiments have been used where appropriate, with some construction differences being indicated with the suffix "b" or with different numerals. Channel region 27 comprises a pair of first portions 70 along upper portions of trench sidewalls 21 that are below pair of source/drain regions 24, 26. First portions 70 comprise GaP (e.g., material 44b). A pair of second portions 80 is along trench sidewalls 21 below pair of first portions 70. Second portions 80 are devoid of GaP (e.g., material 46b). A third portion 42 is below pair of second portions 80, extends around trench base 23, and is devoid of GaP. In one embodiment, first portions 70 consist essentially of GaP and conductivity-modifying dopant therein, and in one embodiment consist of GaP and conductivity-modifying dopant therein. In one embodiment, second portions 80 have no detectable GaP therein. In one embodiment, third portion 42 has no detectable GaP therein. Any other attribute(s) or aspect(s) as shown and/or described herein with respect to other embodiments may be used.

Figure 10:
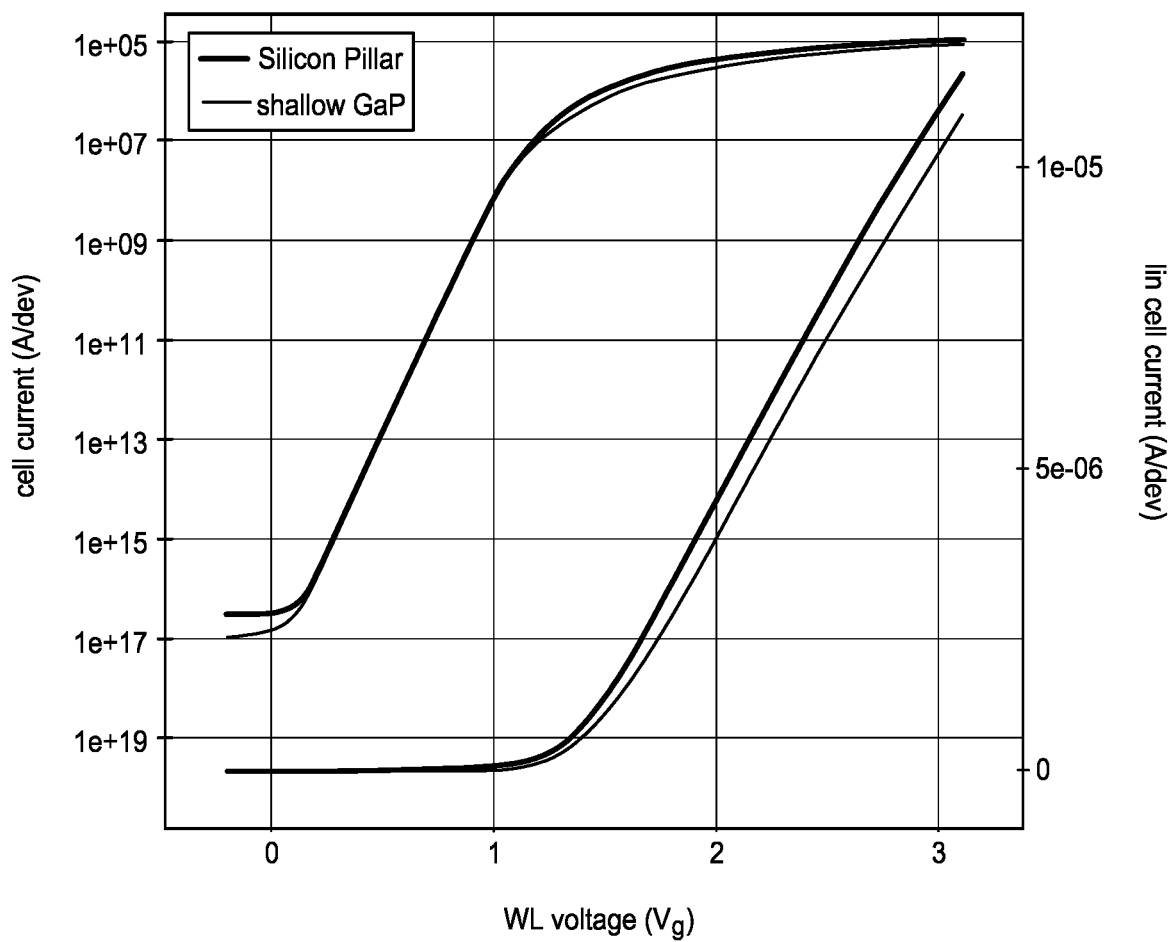
FIG. 10 is a diagram of drain current $I_d$ as a function of gate voltage $V_g$ that may occur in the embodiments of FIG. 9.

FIG. 10 is analogous to FIGS. 5 and 8, but showing plots of drain current $I_d$ (cell current) as a function of gate voltage $V_g$ for channels consisting of Si and conductivity-modifying dopant therein and for channels consisting of GaP and conductivity-modifying dopant therein that may occur for the construction of FIG. 9. The plots are again for cell voltage of 1.1V, digitline voltage of 0V, body/base substrate 11 voltage of −0.5V, digitline resistance of 10,000 ohms, and cell resistance of 20,000 ohms.

The example embodiments may be manufactured using any existing or future-developed method(s). For example, trenches 19 including portions thereof in which insulator material 38 is received could be formed in semiconductor material 12. Alternately, by way of example only, GaP-containing material could be formed above Si-containing material and trenches 19 could be formed in the GaP-containing material. Epitaxial growth may be used.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 450 from exactly horizontal. Further, "extend(ing) elevationally", "elevationally-extending", extend(ing) horizontally, and horizontally-extending with respect to a field effect transistor are with reference to orientation of the transistor's channel length along which current flows in operation between the source/drain regions. For bipolar junction transistors, "extend(ing) elevationally" "elevationally-extending", extend(ing) horizontally, and horizontally-extending, are with reference to orientation of the base length along which current flows in operation between the emitter and collector.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" not preceded by "directly" only requires that some portion of the stated region/material/component that is under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

CONCLUSION

In some embodiments, a recessed access device comprises a conductive gate in a trench in semiconductor material. A gate insulator is along sidewalls and a base of the trench between the conductive gate and the semiconductor material. A pair of source/drain regions is in upper portions of the semiconductor material on opposing sides of the trench. A channel region is in the semiconductor material below the pair of source/drain regions along the trench sidewalls and around the trench base. At least some of the channel region comprises GaP.

In some embodiments, a recessed access device comprises a conductive gate in a trench in semiconductor material. A gate insulator is along sidewalls and a base of the trench between the conductive gate and the semiconductor material. A pair of source/drain regions is in upper portions of the semiconductor material on opposing sides of the trench. A channel region is in the semiconductor material below the pair of source/drain regions along the trench sidewalls and around the trench base. Those portions of the channel region that are along all of the trench sidewalls below the pair of source/drain regions comprise GaP. That portion of the channel region that is directly below the trench base is devoid of GaP.

In some embodiments, a recessed access device comprises a conductive gate in a trench in semiconductor material. A gate insulator is along sidewalls and a base of the trench between the conductive gate and the semiconductor material. A pair of source/drain regions is in upper portions of the semiconductor material on opposing sides of the trench. A channel region is in the semiconductor material below the pair of source/drain regions along the trench sidewalls and around the trench base. Those portions of the channel region that are along all of the trench sidewalls below the pair of source/drain regions and that portion of the channel region that is around the trench base comprising GaP.

In some embodiments, a recessed access device comprises a conductive gate in a trench in semiconductor material. A gate insulator is along sidewalls and a base of the trench between the conductive gate and the semiconductor material. A pair of source/drain regions is in upper portions of the semiconductor material on opposing sides of the trench. A channel region is in the semiconductor material below the pair of source/drain regions along the trench sidewalls and around the trench base. The channel region comprises a pair of first portions along upper portions of the trench sidewalls that are below the pair of source/drain regions. The first portions comprise GaP. A pair of second portions is along the trench sidewalls below the pair of first portions. The second portions are devoid of GaP. A third portion is below the pair of second portions. The third portion extends around the trench base and is devoid of GaP.

In some embodiments, a DRAM construction comprises a pair of recessed access devices individually comprising a conductive gate in a trench in semiconductor material. A gate insulator is along sidewalls and a base of the trench between the conductive gate and the semiconductor material. A pair of source/drain regions is in upper portions of the semiconductor material on opposing sides of the trench. A channel region is in the semiconductor material below the pair of source/drain regions along the trench sidewalls and around the trench base. At least some of the channel region comprises GaP. One of the source/drain regions of the pair of source/drain regions is laterally between the conductive gates and is shared by the pair of recessed access devices. The others of the source/drain regions of the pair of source/drain regions are not shared by the pair of recessed access devices. A digitline is directly electrically coupled to the one shared source/drain region. A pair of capacitors individually are directly electrically coupled to one of the other source/drain regions.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A recessed access device comprising:
   a conductive gate in a trench in semiconductor material, the conductive gate in a straight-line vertical cross-section having opposing sidewalls and a bottom below and extending between the opposing sidewalls;
   a gate insulator between the conductive gate and the semiconductor material, the gate insulator being along the opposing sidewalls and the bottom of the conductive gate in the straight-line vertical cross-section;
   a pair of source/drain regions in upper portions of the semiconductor material on opposing sides of the trench in the straight-line vertical cross-section; and
   a channel region in the semiconductor material, the channel region having a pair of top surfaces below the pair of source/drain regions in the straight-line vertical cross-section, the channel region being below the pair of source/drain regions along the opposing sidewalls of the conductive gate and around the bottom of the conductive gate in the straight-line vertical cross-section, those portions of the channel region that are along all of the opposing sidewalls of the conductive gate below the pair of source/drain regions in the straight-line vertical cross-section comprising GaP, that portion of the channel region that is directly below the bottom of the conductive gate in the straight-line vertical cross-section being devoid of GaP.

2. The recessed access device of claim 1 wherein that portion of the channel region that is directly below the bottom of the conductive gate in the straight-line vertical cross-section has no detectable GaP therein.

3. The recessed access device of claim 1 wherein those portions of the channel region that are along all of the opposing sidewalls of the conductive gate below the pair of source/drain regions in the straight-line vertical cross-section consist essentially of GaP and conductivity-modifying dopant therein.

4. The recessed access device of claim 1 wherein those portions of the channel region that are along all of the opposing sidewalls of the conductive gate below the pair of source/drain regions in the straight-line vertical cross-section consist essentially of GaP and conductivity-modifying dopant therein.

5. The recessed access device of claim 4 wherein those portions of the channel region that are along all of the opposing sidewalls of the conductive gate below the pair of source/drain regions in the straight-line vertical cross-section consist of GaP and conductivity-modifying dopant therein.

6. The recessed access device of claim 1 comprising a charge-storage device directly electrically coupled to one of the pair of source/drain regions.

7. The recessed access device of claim 1 wherein that portion of the channel region that is directly below the bottom of the conductive gate in the straight-line vertical cross-section consists essentially of Si and conductivity-modifying dopant therein.

8. A DRAM construction comprising the recessed access device of claim 1.

9. A recessed access device comprising:
 a conductive gate in a trench in semiconductor material, the conductive gate in a straight-line vertical cross-section having opposing sidewalls and a bottom below and extending between the opposing sidewalls;
 a gate insulator between the conductive gate and the semiconductor material, the gate insulator being along the opposing sidewalls and the bottom of the conductive gate in the straight-line vertical cross-section;
 a pair of source/drain regions in upper portions of the semiconductor material on opposing sides of the trench in the straight-line vertical cross-section; and
 a channel region in the semiconductor material, the channel region having a pair of top surfaces below the pair of source/drain regions in the straight-line vertical cross-section, the channel region being below the pair of source/drain regions along the opposing sidewalls of the conductive gate and around the bottom of the conductive gate in the straight-line vertical cross-section, the channel region comprising:
  a pair of first portions along upper portions of the opposing sidewalls of the conductive gate that are below the pair of source/drain regions in the straight-line vertical cross-section, the first portions comprising GaP;
  a pair of second portions along the opposing sidewalls of the conductive gate below the pair of first portions in the straight-line vertical cross-section, the second portions being devoid of GaP; and
  a third portion below the pair of second portions in the straight-line vertical cross-section, the third portion extending around the bottom of the conductive gate in the straight-line vertical cross-section and being devoid of GaP.

10. The recessed access device of claim 9 wherein the first portions consist essentially of GaP and conductivity-modifying dopant therein.

11. The recessed access device of claim 9 wherein the second portions have no detectable GaP therein.

12. The recessed access device of claim 9 wherein the third portion has no detectable GaP therein.

13. The recessed access device of claim 12 wherein the second portions have no detectable GaP therein.

14. The recessed access device of claim 9 wherein the first portions consist essentially of GaP and conductivity-modifying dopant therein.

15. The recessed access device of claim 14 wherein the first portions consist of GaP and conductivity-modifying dopant therein.

16. The recessed access device of claim 9 comprising a charge-storage device directly electrically coupled to one of the pair of source/drain regions.

17. The recessed access device of claim 9 wherein the second and third portions consist essentially of Si and conductivity-modifying dopant therein.

18. A DRAM construction comprising the recessed access device of claim 9.

* * * * *